(12) United States Patent
Letertre et al.

(10) Patent No.: US 8,541,290 B2
(45) Date of Patent: Sep. 24, 2013

(54) OPTOELECTRONIC SUBSTRATE AND METHODS OF MAKING SAME

(75) Inventors: Fabrice Letertre, Grenoble (FR); Bruce Faure, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/154,510

(22) Filed: Jun. 7, 2011

(65) Prior Publication Data

US 2011/0237008 A1 Sep. 29, 2011

Related U.S. Application Data

(62) Division of application No. 12/424,868, filed on Apr. 16, 2009, which is a division of application No. 11/084,747, filed on Mar. 21, 2005, now Pat. No. 7,537,949.

(30) Foreign Application Priority Data

Jan. 13, 2005 (EP) .................................... 05290082

(51) Int. Cl.
*H01L 21/302* (2006.01)
(52) U.S. Cl.
USPC ............. 438/464; 438/460; 438/29; 438/459; 438/33; 438/455; 438/458; 257/E21.568
(58) Field of Classification Search
USPC ............. 438/459, 464, 460, 29, 33, 455, 458; 257/98, E21.568
See application file for complete search history.

(56) References Cited

U.S. PATENT DOCUMENTS

| | | | |
|---|---|---|---|
| 6,794,276 B2 | 9/2004 | Letertre | 438/506 |
| 6,815,309 B2 | 11/2004 | Letertre et al. | 438/406 |
| 6,824,610 B2 | 11/2004 | Shibata et al. | 117/89 |
| 6,936,357 B2 | 8/2005 | Melnik et al. | 428/698 |

(Continued)

FOREIGN PATENT DOCUMENTS

| | | |
|---|---|---|
| JP | 05-183189 A | 7/1993 |
| JP | 08-064866 A | 3/1996 |

(Continued)

OTHER PUBLICATIONS

Luo et al., "Enhancement of (In,Ga)N Light-Emitting Diode Performance by Laser Liftoff and Transfer from Sapphire to Silicon," IEEE Photonics Technology Letters, 14(10):1400-1402 (2002).

(Continued)

*Primary Examiner* — Matthew Reames
*Assistant Examiner* — Benjamin Tzu-Hung Liu
(74) *Attorney, Agent, or Firm* — Winston & Strawn LLP

(57) ABSTRACT

A method of fabricating a device by providing an auxiliary substrate having a metal nitride layer disposed thereon where the nitride layer has a nitrogen face and an opposite face and a dislocation density that is less than about $10^6$, with the nitrogen face of the nitride layer facing the auxiliary substrate; depositing at least one epitaxial nitride layer on the exposed opposite face of the nitride layer of the structure; depositing a further metal layer over at least a portion of the epitaxial nitride layer(s); bonding a final substrate on the deposited metal layer; and removing the auxiliary substrate to form the device from the final substrate and deposited layers. Preferably, the device that is formed includes a LED or laser.

17 Claims, 4 Drawing Sheets

(56) References Cited

U.S. PATENT DOCUMENTS

| | | |
|---|---|---|
| 7,052,974 B2 | 5/2006 | Mitani et al. ............ 438/459 |
| 7,148,124 B1* | 12/2006 | Usenko ............ 438/458 |
| 7,179,671 B2* | 2/2007 | Okazaki et al. ............ 438/26 |
| 7,196,399 B2 | 3/2007 | Usui et al. ............ 257/615 |
| 7,315,064 B2 | 1/2008 | Mitani et al. ............ 257/347 |
| 2001/0042866 A1 | 11/2001 | Coman et al. ............ 257/103 |
| 2003/0153163 A1 | 8/2003 | Letertre et al. ............ 438/458 |
| 2003/0164503 A1 | 9/2003 | Chen ............ 257/79 |
| 2003/0232487 A1* | 12/2003 | Letertre et al. ............ 438/459 |
| 2004/0012032 A1 | 1/2004 | Toda et al. ............ 257/103 |
| 2004/0014299 A1 | 1/2004 | Moriceau et al. ............ 438/459 |
| 2004/0029359 A1 | 2/2004 | Letertre et al. ............ 438/458 |
| 2005/0093101 A1 | 5/2005 | Matsumoto ............ 257/617 |
| 2005/0104162 A1* | 5/2005 | Xu et al. ............ 257/627 |

FOREIGN PATENT DOCUMENTS

| | | |
|---|---|---|
| JP | 2000-228537 A | 8/2000 |
| WO | WO 03/049189 A1 | 6/2003 |
| WO | WO 03/063214 A2 | 7/2003 |
| WO | WO 2005/004231 A1 | 1/2005 |

OTHER PUBLICATIONS

Northrup et al., "Strong affinity of hydrogen for the GaN(000-1) surface: Implications for molecular beam epitaxy and metalorganic chemical vapor deposition," Applied Physics Letters, 85(16):3429-3431 (2004).

Official Notice of Rejection for Japanese Application No. 2007-550755 mailed Mar. 29, 2011.

* cited by examiner

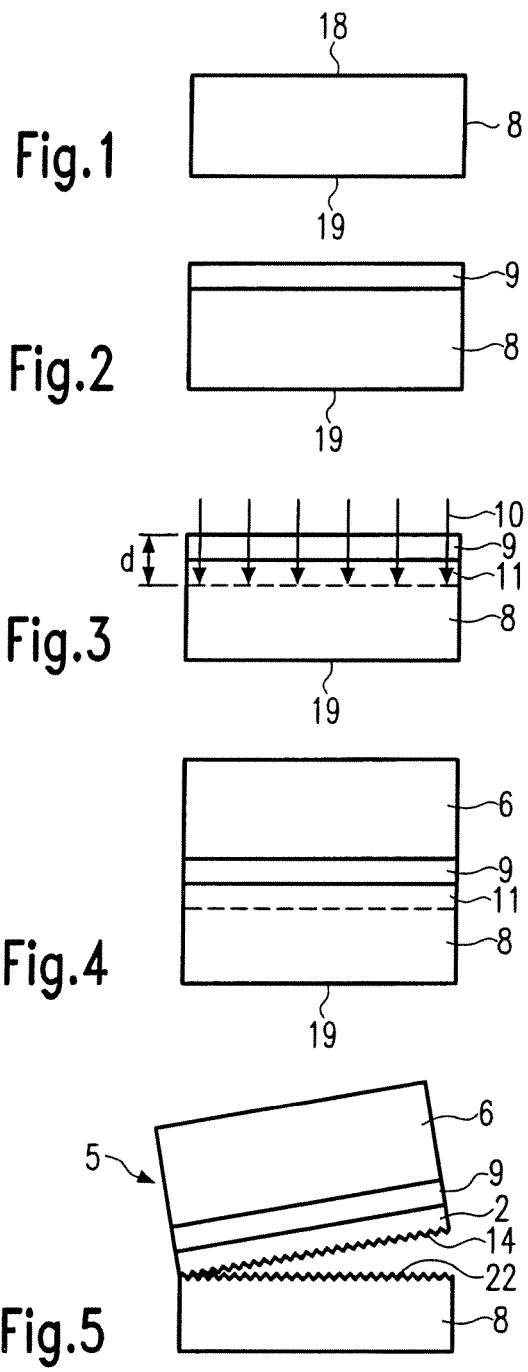

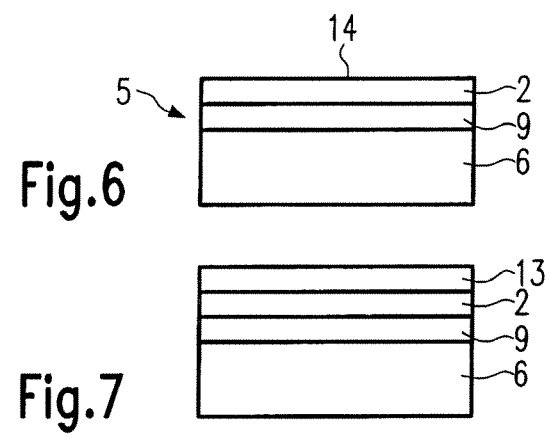
Fig.6
Fig.7
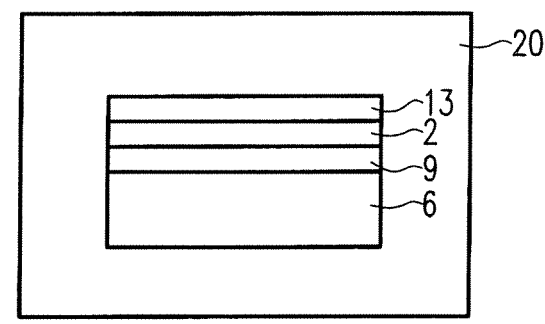
Fig.8
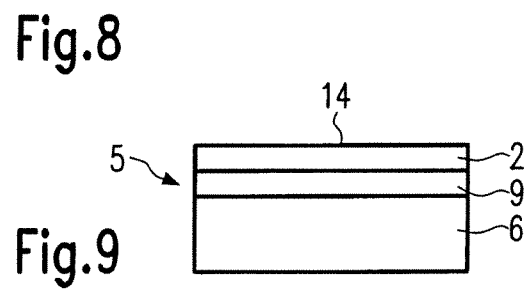
Fig.9

OPTOELECTRONIC SUBSTRATE AND METHODS OF MAKING SAME

CROSS-REFERENCE TO RELATED APPLICATIONS

This application is a division of application Ser. No. 12/424,868 filed Apr. 16, 2009, which is a division of application Ser. No. 11/084,747 filed Mar. 21, 2005 now U.S. Pat. No. 7,537,949.

FIELD OF THE INVENTION

Articles including an optoelectronic substrate having at least one active nitride layer on a final substrate and a metallic intermediate layer therebetween. These articles are made by preparing an auxiliary substrate wherein one semi-conducting nitride layer is placed on an auxiliary substrate; metallizing the auxiliary substrate on the nitride layer; bonding the metallized nitride layer and auxiliary substrate with a final substrate; and then removing the auxiliary substrate to obtain a nitride layer and subjacent metallized layer upon the final substrate.

BACKGROUND

In the field of optical applications, GaN-based light emitting devices including light emitting diodes (LEDs) and laser diodes have attracted great attention in recent years because these devices are capable of generating short wavelength emissions in UV and blue regions, which can have many practical applications such as high density storage, high speed data processing, solid state lighting, flat panel color display, and quantum computing. The realization of GaN-based layers, however, is relatively recent in comparison to GaAs-based layers. Therefore, the technology of GaN-based layers is still in the development stage, and many technical issues remain to be addressed and resolved before those applications can be realized.

Considering the state of the art, it is known to produce GaN-on-sapphire templates for blue LED mass production. In a first step of a conventional approach, a GaN nucleation layer is grown on a sapphire substrate. In a second step, a two to four microns thick GaN buffer layer is grown on the nucleation layer. This growth step is very time-consuming and takes typically from two to four hours. In a last step, an InGaN/AlGaN/GaN-LED structure including cladding layers, multiple quantum valves and p-type layers with a total thickness of the LED structure of about 1 μm is grown on the GaN buffer layer.

Despite the fact that a high device yield can be achieved with such conventional technology, the resulting structures have some disadvantages. While the sapphire substrate is less expensive, and a more popular choice than a high cost GaN-substrate, it is non-conductive, requiring two wire bonds on top of each chip. With the electrical current travelling laterally between these two contacts, the packaging efficiency is greatly reduced. While sapphire is transparent, enabling more light to escape from the chip, it unfortunately acts as a thermal insulator that traps heat, dramatically reducing the high operating current efficiency and ultimately limiting the available applications.

Furthermore, due to the lattice mismatch and temperature expansion co-efficient difference between sapphire and GaN, the GaN device structures grown on a sapphire substrate are known to have many defects that tend to affect the device performance. Other factors, such as the insulating property and non-cleavage of sapphire material, make manufacture of a GaN light emitting device with such conventional process technology difficult.

Instead of sapphire substrates, SiC substrates can be used to grow thereon a GaN-layer. However, although conductive, SiC traps a substantial portion of the light being emitted because massive absorption occurs only in the UV range.

Therefore, in another known approach for producing vertical GaN-LEDs, under consideration of the above-mentioned advantages and disadvantages of sapphire and SiC substrates, a sapphire substrate can be used as the initial GaN growth substrate followed by bonding a thermally and electrically conductive metal layer on top of the GaN. By then employing an appropriate lift-off technique, the sapphire substrate is lifted off the GaN, leaving it and the reflective base ready for the fabrication of vertical devices.

The result of a vertical device being bonded to a reflective metal layer that exhibits low thermal resistance, and high electrical conductivity, leads to efficient devices that lend themselves to thinner LED packaging while remaining rugged enough to retain comfortability with traditional die-mount techniques. Due to a high brightness, this approach is especially advantageous for back light applications such as cellular phones, where a thinner die saves precious space, as well as for high power/super bright applications, such as solid-state white lighting.

Nevertheless, even this approach cannot prevent or avoid the disadvantages arising out of the difference of material properties between the sapphire substrate and the GaN-layer grown thereon. In particular, the dislocation density of the active nitride layer(s) of such substrates, which is usually in the order of $10^8/cm^2$, strongly restrains the efficiency of optical devices fabricated with such substrates.

It is therefore desired to provide a method of forming GaN-type layers in which the crystalline quality of the active nitride layer(s) can be improved.

SUMMARY OF THE INVENTION

The present invention encompasses a method of producing an optoelectronic substrate by detaching a thin layer from a semi-conducting nitride substrate and transferring it to an auxiliary substrate to provide at least one semi-conducting nitride layer thereon, metallizing at least a portion of the surface of the auxiliary substrate that includes the transferred nitride layer, bonding to a final substrate the metallized surface portion of the transferred nitrate layer of the auxiliary substrate, and removing the auxiliary substrate to provide an optoelectronic substrate comprising a semi-conducting nitride surface layer over a subjacent metallized portion and a supporting final substrate.

In particular, the invention relates to a method of fabricating a device by providing an auxiliary substrate having a metal nitride layer disposed thereon where the nitride layer has a nitrogen face and an opposite face and a dislocation density that is less than about $10^6$, with the nitrogen face of the nitride layer facing the auxiliary substrate; depositing at least one epitaxial nitride layer on the exposed opposite face of the nitride layer of the structure; depositing a further metal layer over at least a portion of the epitaxial nitride layer(s); bonding a final substrate on the deposited metal layer; and removing the auxiliary substrate to form the device from the final substrate and deposited layers. Preferably, the device that is formed includes a LED or laser.

In this method, the nitrogen face of the nitride layer is prepared to have a surface roughness of less than 0.3 nm RMS as measured with an atomic force microscope over a field of 1×1 μm², while the opposite face of the nitride layer has a roughness on the order of a few Angstroms RMS as measured with an atomic force microscope over a field of 1×1 μm². The deposited epitaxial layers are preferably n type GaN, AlGaN, InGaN, or n type GaN having a thickness of between 0.1 to 1 micron and more preferably about 0.5 micron. The opposite face of the nitride layer is preferably a metal face of a Group III element such as GaN or AlN. Also, the auxiliary substrate typically comprises at least one of silicon, GaAs, or ZnO.

The invention also encompasses an optoelectronic substrate that includes a substrate, a metallized layer disposed over at least a portion of the substrate, and at least one nitride layer disposed over the metallized layer, wherein the dislocation density of the nitride layer(s) is less than about $10^8/cm^2$.

BRIEF DESCRIPTION OF THE DRAWINGS

Further advantageous features of the present invention will become more apparent with the following detailed description when taken with reference to the accompanying drawings in which:

FIG. 1 schematically shows a step of providing a massive semi-conductive nitride substrate according to an embodiment of the present invention;

FIG. 2 schematically shows a deposition step of a dielectric layer on the substrate of FIG. 1 according to an embodiment of the present invention;

FIG. 3 schematically shows an implantation step in the structure of FIG. 2 according to an embodiment of the present invention;

FIG. 4 schematically shows a bonding step of the structure of FIG. 3 with an auxiliary substrate according to an embodiment of the present invention;

FIG. 5 schematically shows a splitting step of the structure of FIG. 4 according to an embodiment of the present invention;

FIG. 6 schematically shows a polishing step of a split structure of FIG. 5 according to an embodiment of the present invention;

FIG. 7 schematically shows a deposition step of a protective layer on the structure of FIG. 6 according to an embodiment of the present invention;

FIG. 8 schematically shows an annealing step of the structure of FIG. 7 according to an embodiment of the present invention;

FIG. 9 schematically shows a removal step of the protective layer of the structure of FIG. 7 after the annealing step of FIG. 8 according to an embodiment of the present invention;

Figure 10:
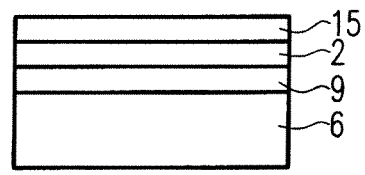
FIG. 10 schematically shows a growth step of an epitaxial layer on the structure of FIG. 9 according to an embodiment of the present invention.

It should be noted that the dimensions shown in the Figures are not true to scale.

DETAILED DESCRIPTION OF THE INVENTION

While the present invention is described with reference to the embodiments as illustrated in the following detailed description as well as in the drawings, it should be understood that the following detailed description as well as the drawings are not intended to limit the present invention to the particular illustrative embodiments disclosed, but rather to describe the illustrative embodiments merely exemplifying the various aspects of the present invention, the scope of which is defined by the appended claims.

The present invention advantageously can achieve such nitride layers by preparing the auxiliary substrate through detaching a part from a massive semi-conducting nitride substrate; and transferring said part onto the auxiliary substrate to form the semi-conducting nitride layer thereon.

With the inventive method, substrates for optoelectronic applications having active layer(s) with a low density of crystalline defects can be fabricated. In particular, the dislocation density of the active layer(s) can be brought to below about $10^8/cm^2$ although the active layer(s) can be made with a low thickness. Thus, optoelectronic devices fabricated by using the inventive substrates and methods can achieve a high efficiency and lifetime at low dimensions and weight.

Furthermore, the intermediate metal layer can facilitate suitable or increased electrical conduction between the active nitride layer(s) and the auxiliary carrier substrate and can serve additionally as a thermal drain between the active layer(s) and the auxiliary substrate. This way, the final substrate can be electrically well-contacted and thermal stress during operation can be minimized to a low value.

According to a beneficial embodiment of the present invention, the semi-conducting nitride substrate is a GaN-substrate or an AlN substrate. GaN and AlN have the advantage that the growth of these materials, as well as their properties, are relatively well known so that these materials can be provided with a high crystal quality.

For example, the massive semi-conducting nitride substrate can be produced with a dislocation density of less than about $10^6/cm^2$. The term "massive" preferably means a sufficiently large block or other mass of nitride substrate that multiple portions can be removed to form multiple layers according to the invention. Because of the very low dislocation density of the semi-conducting nitride substrate, from which the semi-conducting nitride layer is detached, the nitride layer formed on the auxiliary substrate can also be provided with a very low dislocation density resulting in a low dislocation density of layer(s) grown subsequently on the transferred semi-conducting nitride layer according to the invention. With this method, the active part of the resulting substrate has a very good crystallinity independent from the properties of the final substrate.

By way of another example, the detaching and transferring comprises: depositing a dielectric layer on the semi-conducting nitride substrate, implanting atomic species through the dielectric layer into a certain depth of the nitride substrate to form therein a predetermined splitting area, which is also referred to herein a weakened region or weakened zone, bonding of the nitride substrate on the implanted side with the auxiliary substrate; and thermal and/or mechanical treating of the nitride substrate to split, or weaken, said substrate along the predetermined splitting area. These steps are taken from the known SMART-CUT® process technology and lead to a smooth and highly accurate transfer of a high quality nitride layer with a defined thickness onto the auxiliary substrate.

In an advantageous embodiment of the present invention, the auxiliary substrate is a substrate that includes silicon, GaAs or ZnO. These substrates can provide a high mechanical strength that is explicitly favorable during the detaching and transferring in which the auxiliary substrate is under relatively high mechanical stress. Furthermore, the coefficient of thermal dilation of GaAs and ZnO is slightly higher than the coefficient of thermal dilation of typical semi-conducting nitride layers such as GaN or AlN, resulting in an active layer of the final substrate having only slight compression that inhibits or prevents occurrence of cracking effects in the active layer.

According to another beneficial variant of the present invention, the auxiliary substrate is annealed after the detaching and transferring. The annealing step reinforces connection at the interface between the transferred nitride layer and the auxiliary substrate.

In a further example, a protective layer is brought onto the transferred nitride layer before the annealing and is removed thereafter. This way, the transferred nitride layer can be protected from chemical influences in the annealing environment which could otherwise lead to chemical reaction(s) with the nitride layer or to other unintentional changes of crystallinity or purity of the nitride layer.

In another preferred embodiment, the surface of the transferred nitride layer is smoothed after the detaching and transferring or after the annealing. The removal of a certain degree of roughness of the transferred nitride layer surface facilitates usefulness in forming subsequent layers that can be better deposited on a smooth subsurface. This smoothing can be implemented before or after the annealing.

It is furthermore advantageous to deposit at least one epitaxial nitride layer of a material of a group including N-doped GaN, InGaN, AlGaN, undoped GaN and P-doped GaN on the transferred nitride layer of the auxiliary substrate. The additional epitaxial nitride layer(s) are well suited to form the active layer(s) of an optoelectronic structure.

In a preferred embodiment, the metallic intermediate layer is deposited on the at least one epitaxial nitride layer. This way, the metallic intermediate layer can form an Ohmic contact for the at least one epitaxial nitride layer. Depending on the metal species chosen to form the intermediate layer, it could be useful to anneal to create an alloy between the nitride material and the metals, which allows a shift from a Schottky to an Ohmic contact behavior. The transferred thin layer can be removed from the nitride substrate after removing the auxiliary substrate to expose the epitaxial nitride layer.

In another example, the method further includes providing a final substrate and bonding of the final substrate on the metallized side of the auxiliary substrate. The final substrate provides a good mechanical support for the transferred nitride layer and the deposited at least one epitaxial nitride layer from the side opposite to the auxiliary substrate.

In a beneficial variant, the material of the final substrate includes at least one of silicon, silicon carbide, or copper. These materials provide good electrical and thermal conductivity, which is particularly relevant for a later optoelectronic application of the produced substrate wherein the electrical conductivity can be used to form an Ohmic contact on the final substrate and the thermal conductivity serves to provide a good thermal drainage for an optoelectronic device with the final substrate.

In a yet further advantageous embodiment, at least one reflection layer is deposited onto the final substrate before the bonding step of the final substrate with the auxiliary substrate. The reflection layer serves as a mirror between the active layer(s) and the final substrate so that the light emitted from the active layer(s) will not be absorbed by the final substrate.

According to another embodiment, the auxiliary substrate is removed mechanically and/or chemically after the bonding, wherein the nitride layer is used as a stop layer for the removal step. In this step, the active layer(s) of the final substrate can be excavated.

In yet another advantageous embodiment, the transferred nitride layer can be removed from the substrate after the removal step of the auxiliary substrate. The removal of non-essential layer(s), such as the transferred nitride layer, improves the efficiency of the whole structure since inutile layer(s) would lead to an unwanted absorption of photons emitted from the active layer(s).

According to the present invention, an efficient method of producing substrates for optoelectronic applications, referred to herein as optoelectronic substrates, is provided that may be used to fabricate optoelectronic devices, such as LED structures or laser diodes. FIGS. 1 to 16 show an illustrative process flow of an embodiment of the present invention, which includes many optional but preferred steps according to the invention.

With reference to FIG. 1, a step of providing a massive semi-conducting nitride substrate is shown. In the embodiment shown, the massive semi-conducting nitride substrate is a GaN-substrate 8 having a nitrogen face 18 on top and on its bottom a gallium face 19. The massive GaN-substrate has a hexagonal crystal structure with a dislocation density of lower than $10^6/cm^2$. The planarity of the substrate 8 is in the range of 20 µm. The nitride substrate 8 has a thickness of about 150 to 750 µm. The nitrogen face 18 of the nitride substrate 8 is polished and preferably has a surface roughness of lower than 0.3 nm RMS measured with an atomic force microscope (AFM) over a field of some $1 \times 1$ µm$^2$.

The above-described technology can also be realized using a semi-conducting nitride substrate of GaN with a cubic crystal structure or with a cubic or hexagonal monocrystalline AlN substrate instead of the hexagonal GaN-substrate 8. In all of these cases, however, the dislocation density of the substrate 8 should be from about $10^5$ to $10^6/cm^2$ or even lower.

FIG. 2 schematically shows a deposition step of a dielectric layer 9 on the massive semi-conducting nitride substrate 8. This deposition step is typically performed on the nitrogen face 18 of the nitride substrate 8. Preferably, a dielectric layer is provided on the semi-conducting nitride substrate prior to detaching the thin layer and dielectric layer and transferring them to the auxiliary substrate. The dielectric layer 9 can be a material that includes silicon dioxide, silicon nitride, or a combination of these materials or other dielectric materials that will have sufficient adhesion to the nitrogen face 18 of the GaN-substrate 8 to remain deposited thereon. More than one dielectric layer (not shown) can be provided in successive fashion if desired, and each layer can include the same or different material(s) compared to the other dielectric layers. The dielectric layer(s) 9 are preferably deposited by chemical vapor deposition, although any other deposition method available to those of ordinary skill in the art may be used. Although not absolutely necessary, the structure shown in FIG. 2 can be optionally, but preferably, thermally annealed to increase the density of the dielectric layer(s) 9.

Preferably, the inventive methods involve implanting at least one atomic species through the dielectric layer and into the nitride substrate to a certain depth (d) therein to form a weakened region, bond the dielectric layer to the auxiliary substrate, and detach the thin layer and dielectric layer along the weakened region for transfer to the auxiliary substrate.

As illustrated in FIG. 3, the structure shown in FIG. 2 is implanted with atomic species 10. The species 10 can be of hydrogen, helium, or other suitable elements alone or in combination. In the embodiment shown, the species 10 are implanted with energies from about 20 and 200 keV and with doses from about $10^{15}$ and $10^{18}$ at/cm². The atomic species 10 are implanted to a pre-determined depth d of the nitride substrate 8, thereby forming a predetermined splitting area 11, at and around the implantation depth d.

According to FIG. 4, the implanted structure of FIG. 3 is bonded on its implanted side with an auxiliary substrate 6. The auxiliary substrate 6 is preferably a silicon substrate, GaAs substrate, or a ZnO substrate, but can also be of another suitable carrier material which has relatively high mechanical stability because this material will be highly stressed during a following SMART-CUT® process in which the nitride substrate 8 is split. In the case of GaAs or ZnO as auxiliary substrate 6, the thermal dilation coefficient of the auxiliary substrate 6 is chosen or adapted in such a way that it is at least slightly higher than the thermal dilation coefficient of GaN, resulting in a structure having a GaN-layer with a slight compression that inhibits or prevents the appearance of cracking in this layer.

As shown in FIG. 5, the structure of FIG. 4 is split into two parts with thermal and/or mechanical treatment. The stress applied due to that treatment leads to the splitting of the structure of FIG. 4 along the predetermined splitting area 11. The splitting step results in two structures, a residual part of the former semi-conductive nitride substrate 8 and an auxiliary substrate 5 consisting of the auxiliary substrate 6, the dielectric layer 9 and a semi-conducting nitride layer 2 being a part of the former semi-conducting nitride substrate 8. The split structures have split surfaces 14 and 22 with an increased roughness after the splitting step.

With reference to FIG. 6, the auxiliary substrate 5 is preferably smoothed in a polishing step applied on the split surface 14 of the nitride layer 2. After this polishing step, the surface roughness of the GaN-layer 2 is of an atomic level which is only several Angstroms when measured with an AFM.

In the next step, shown in FIG. 7, a protective layer 13 is deposited on the surface 14 of the GaN-layer 2. The protective layer 13 is preferably a dielectric layer. Although not shown, additional dielectric layers of the same or different materials could be deposited.

As shown in FIG. 8, the structure of FIG. 7 is thermally annealed in annealing equipment 20. The structure is thermally treated in a temperature region from about 500° C. to 1100° C. in a gaseous atmosphere that minimizes or avoids degradation of the crystal quality of the GaN-layer 2. The annealing step shown in FIG. 8 can also be applied before the polishing step shown in FIG. 6, and can also be applied directly onto the auxiliary substrate 5 without the deposition of the protective layer 13 before optionally annealing. The thermal annealing can increase the bonding forces at the interface between the auxiliary substrate 6 and the dielectric layer 9.

As shown in FIG. 9, the protective layer 13 that can be deposited before the annealing step shown in FIG. 8, is later removed. Preferably, the protective layer 13 can be removed with a chemical treatment, for instance with HF or another suitable acid. The removal results in the auxiliary substrate 5 having a smooth and clean gallium face 14 on top of the GaN-layer 2. The GaN-layer 2 is monocrystalline with a crystal quality at least substantially equivalent to the crystal quality of the massive semi-conducting nitride substrate 8 shown in FIG. 1. The surface of the GaN-layer 2 is substantially free from undesired particles or other impurities. The thickness of the GaN-layer 2 is, in one preferred embodiment, about 200 nm. Other preferred thicknesses include from about 150 nm to 250 nm, although others are also included in the scope of the invention.

With reference to FIG. 10, an epitaxial nitride layer 15 can be deposited on the gallium face 14 of the GaN-layer 2. The epitaxial nitride layer 15 can be deposited with a known epitaxy method like MOCVD, MBE, or HYPE. The temperature applied during the epitaxial deposition step is preferably in the range of about 700° C. to 1100° C.

For example, the epitaxial nitride layer(s) deposited in the step shown in FIG. 10 can be: of n-type GaN doped with Si and having a thickness of about 0.2 microns, of InGaN, of AlGaN and/or of p-type GaN doped with Mg. The total thickness of the epitaxial nitride layer(s) 15 can include any suitable thickness, typically about 0.1 microns to 1 microns, and a preferred exemplary thickness includes that of about 0.5 micron. The composition of the epitaxial nitride layer(s) depends on the efficiency and the wavelength of the optoelectronic structure that will be fabricated with the resulting substrate. The dislocation density of the epitaxial nitride layer(s) 15 is nearly equivalent to the dislocation density of the original GaN-substrate 8, which means no more than, and preferably lower than, about $10^6$/cm². It is generally advantageous to have epitaxial nitride layer(s) with an increased thickness to advance current propagation in the active layer(s) of the resulting structure.

Figure 11:
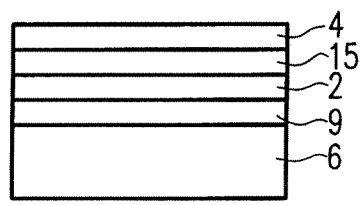
FIG. 11 schematically shows a deposition step of a metal layer on the structure of FIG. 10 according to an embodiment of the present invention.

In a next step, shown in FIG. 11, a metal layer 4 is deposited on the epitaxial nitride layer(s) 15, i.e., metallization according to the invention. The metal layer 4 serves later as an Ohmic contact to contact the resulting structure electrically. The metal layer 4 can be of Ni/Au, Pt, rhodium, or any other suitable conductive material, alloy, or combination of metals. The metallized layer is disposed over a sufficient portion of the final substrate, e.g., over the entire epitaxial nitride layer, to increase electrical contact between the final substrate and the at least one nitride layer. Thus, the metal layer is subadjacent the nitride layer on the final substrate.

Figure 12:
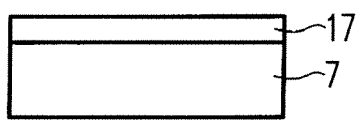
FIG. 12 schematically shows a final substrate with a reflection layer according to an embodiment of the present invention.

With reference to FIG. 12, a final substrate 7 is provided on which a reflection layer 17 can be optionally, but preferably, deposited. The final substrate 7 serves as a support substrate that is electrically conductive with a low electrical resistivity and a good thermal conductivity. The final substrate 7 can be of silicon, SiC, copper, or any other suitable conductive or semi-conducting material. The reflection layer 17 can be for instance of gold, aluminium, or silver, which materials have good reflectivity. The reflection layer 17 acts later as a mirror layer arranged between the final substrate 7 and the epitaxial nitride layer(s) 15. The mirror qualities selected is or are chosen depending on the emitted wavelength(s) of the resulting structure.

Figure 13:
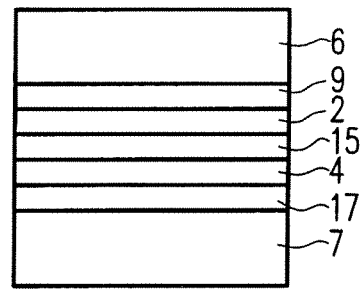
FIG. 13 schematically shows a bonding step between the structures of FIGS. 11 and 12 according to an embodiment of the present invention.

As illustrated in FIG. 13, the structures of FIGS. 11 and 12 are connected on the metal layer 4 and the reflection layer 17 through bonding. The bonding leads to a molecular adhesion between the structures of FIGS. 11 and 12 to provide a contact therebetween using mechanical pressure and a sufficient temperature. The at least one reflection layer is preferably deposited onto the final substrate before the bonding of the final substrate to the auxiliary substrate.

Figure 14:
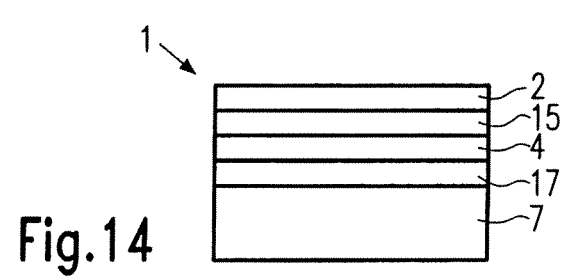
FIG. 14 schematically shows the structure of FIG. 13 after a removal step of the auxiliary substrate and the dielectric layer according to an embodiment of the present invention.

As shown in FIG. 14, in a further step the auxiliary substrate 6 and the dielectric layer 9 are removed from the bonded structure. The removal can include mechanical lapping and/or polishing, chemical attack using the gallium nitride layer 2 as an etch stop layer, or any combination of these or other suitable removal techniques available to those of ordinary skill in the art. If the final substrate 7 is made of silicon, e.g., the removal can be realized using mechanical treatment followed by chemical treatment based on a TMAH or HF/HNO3 solution. Such a chemical attack can be accomplished by immersing the structure in a bath of the solution using equipment with which the structure can be rotated and in which the auxiliary substrate can be exposed to the chemical solution. The removal of the auxiliary substrate can also be realized by using chemical treatment alone.

Figure 15:
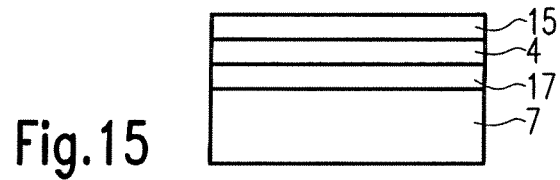
FIG. 15 schematically shows the structure of FIG. 14 after the removal of a semi-conducting nitride layer according to an embodiment of the present invention.

In a next step shown in FIG. 15, the gallium nitride layer 2 is removed from the structure shown in FIG. 14. A removal of inutile layers, such as the non-doped GaN-layer 2, can result in an enhancement of efficiency of the resulting structure in that such useless layers would only lead to an unfortunate and unnecessary absorption of photons. GaN absorbs, for instance, UV radiation.

Figure 16:
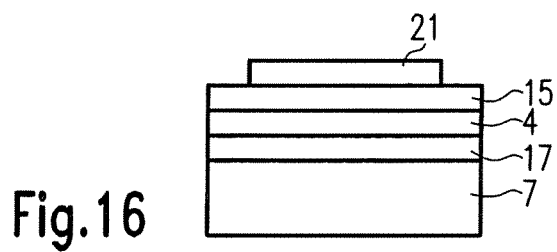
FIG. 16 schematically shows a preparation of an electrical contact on the structure of FIG. 15 according to an embodiment of the present invention.

With reference to FIG. 16, an electrical contact 21 can be provided on the epitaxial nitride layer(s) 15. The resulting structure depicted includes the final substrate 7, the reflection layer 17, the metal layer 4, the epitaxial nitride layer(s) 15, and the electrical contact 21. The metal layer 4 and the reflection layer 17 form together a metallic junction or metallic intermediate layer between the auxiliary substrate 7 and the epitaxial nitride layer(s) 15. The metallic intermediate layer can include or not include the reflection layer 17.

In the following optional but preferred steps, which are not shown, the structure shown in FIG. 16 is further processed by using lithographic and etch steps for chip fabrication, deposition steps of dielectric layers for preservation of the structure, and deposition steps of metal layers to obtain contacts on both sides of the structure. Finally, the fabricated structures are typically separated into chips which are packaged.

With the inventive method, a substrate with an active layer of high good crystal quality having minimized dislocation density of less than about $10^8/cm^2$, preferably less than about $10^7/cm^2$, and more preferably less than about $10^6/cm^2$, and with eliminated inutile layers can be realized for optoelectronic applications. The good crystal quality is very important for a high efficiency and long life span of the structures, in particular for LED structures of laser diodes. In a most preferred embodiment, the substrates prepared according to the invention have a dislocation density of less than about $10^6/cm^2$, substantially equivalent to the original nitride substrate used as a starting material. Furthermore, the elimination of GaN inutile layers in the inventive method allows minimization of photon absorption in the active layer(s), resulting in a high efficiency of light radiation. The inventive technology uses the very good crystallinity of the massive nitride substrate in a direct transfer of a part of said substrate to the final substrate. This way, the final active epitaxial nitride layer(s) can be grown directly on the high quality transferred part with the same good crystallinity leading to high quality final structures.

The term "about," as used herein, should generally be understood to refer to both numbers in a range of numerals. Moreover, all numerical ranges herein should be understood to include each whole integer within the range.

The term "substantially free," as used herein, means less than about 5 weight percent, preferably less than about 1 weight percent, and more preferably less than about 0.5 weight percent. In a preferred embodiment, it means less than about 0.1 weight percent. "Completely free" or "free" of a material refers to its complete absence.

Although preferred embodiments of the invention have been described in the foregoing description, it will be understood that the invention is not limited to the specific embodiments disclosed herein but is capable of numerous modifications by one of ordinary skill in the art. It will be understood that the materials used and the chemical or processing details may be slightly different or modified from the descriptions herein without departing from the methods and compositions disclosed and taught by the present invention.

What is claimed is:

1. An improved method of fabricating a device having a Group III nitride layer, in which method an auxiliary substrate is provided having a first Group III nitride layer disposed thereon, and then at least one epitaxial Group III nitride layer is deposited on an exposed face of the first Group III nitride layer, and then a further metal layer is deposited over at least a portion of the epitaxial Group III nitride layer(s), and then a final substrate is bonded on the deposited metal layer, and finally the auxiliary substrate is removed to form the device from the final substrate and deposited layers, wherein the improvement comprises providing the auxiliary substrate by the steps comprising:

preparing a bonding surface of a free-standing Group III nitride substrate by polishing the N-face of such substrate and then by depositing a dielectric layer onto the polished N-face, wherein the free-standing Group III nitride substrate has a dislocation density that is less than about $10^6$ and an exposed Ga-face opposite to the N-face;

implanting one or more atomic species through the dielectric layer into the Group III nitride substrate in order to form a splitting area below the N-face of Group III nitride substrate;

bonding the bonding surface of the dielectric layer of the free-standing Group III nitride substrate to the auxiliary substrate; and splitting the free-standing Group III nitride substrate at the splitting area to leave the auxiliary substrate with the first Group III nitride layer disposed thereon, the first Group III nitride layer having a nitrogen face that faces the auxiliary substrate and an opposite Ga-face that is exposed.

2. The improved method of claim 1 wherein the improvement further comprises polishing the exposed Ga-face of the split surface of the first Group III nitride layer.

3. The improved method of claim 2, wherein the exposed Ga-face of the metal nitride layer has a roughness on the order of a few Angstroms RMS as measured with an atomic force microscope over a field of $1\times1$ $\mu m^2$.

4. The method of claim 3, which further comprises depositing one or more epitaxial layers upon the exposed Ga-face of the metal nitride layer.

5. The method of claim 4, wherein each deposited epitaxial layer has a dislocation density that is less than about $10^6$.

6. The method of claim 4, wherein each deposited epitaxial layers comprises n type GaN, AlGaN, or InGaN.

7. The method of claim 4, wherein each epitaxial layer is deposited to a thickness of between 0.1 to 1 micron.

8. The method of claim 4, wherein each deposited epitaxial layer has a thickness of about 0.5 micron.

9. The method of claim 4, which further comprises providing an electrical contact on the deposited epitaxial layer(s).

10. The improved method of claim 1 wherein the fabricated device is structured to function as a high-efficiency, long-lived optoelectronic device.

11. The improved method of claim 1, wherein the device that is formed includes a LED or laser.

12. The improved method of claim 1, wherein the nitrogen face of the Group III nitride substrate is polished to have a surface roughness of less than 0.3 nm RMS as measured with an atomic force microscope over a field of 1×1 µm².

13. The method of claim 1, wherein the auxiliary substrate has a coefficient of thermal expansion that is higher than that of the metal nitride layer.

14. The method of claim 1, which further comprises removing the Group III nitride layer after removing the auxiliary substrate.

15. The method of claim 1, wherein the Group III nitride layer is GaN or AlN.

16. The method of claim 1, wherein the auxiliary substrate comprises at least one of silicon, GaAs, or ZnO.

17. The method of claim 1, which further comprises providing a reflection layer disposed upon the Ga-face of metal nitride layer of the auxiliary substrate.

* * * * *